United States Patent
Zhilinsky

(10) Patent No.: US 11,580,266 B2
(45) Date of Patent: Feb. 14, 2023

(54) INSERTION OF ANNOTATION LABELS IN A CAD DRAWING

(71) Applicant: Bricsys NV, Ghent (BE)

(72) Inventor: Vitaly Zhilinsky, Novosibirsk (RU)

(73) Assignee: BRICSYS NV, Ghent (BE)

(*) Notice: Subject to any disclaimer, the term of this patent is extended or adjusted under 35 U.S.C. 154(b) by 254 days.

(21) Appl. No.: 16/574,409

(22) Filed: Sep. 18, 2019

(65) Prior Publication Data
US 2020/0097617 A1 Mar. 26, 2020

(30) Foreign Application Priority Data
Sep. 21, 2018 (EP) .................................. 18195874.5

(51) Int. Cl.
*G06F 30/00* (2020.01)

(52) U.S. Cl.
CPC ........ *G06F 30/00* (2020.01); *G06T 2219/004* (2013.01)

(58) Field of Classification Search
CPC ... G06F 30/00; G06T 2219/004; G06T 11/00; G06T 19/00
USPC .......................................................... 703/1
See application file for complete search history.

(56) References Cited

U.S. PATENT DOCUMENTS

| | | | | |
|---|---|---|---|---|
| 6,904,392 B1* | 6/2005 | Marty | ...................... | G06T 19/00 345/651 |
| 7,636,096 B2 | 12/2009 | Mikulecky | | |
| 8,749,588 B2* | 6/2014 | Herman | ................... | G06T 19/00 345/681 |
| 10,198,412 B2* | 2/2019 | Lopez | ................... | G06F 40/169 |
| 2005/0288909 A1 | 12/2005 | Mikulecky | | |
| 2012/0259983 A1* | 10/2012 | Nakadai | ................ | G06F 9/5083 709/226 |
| 2012/0284791 A1* | 11/2012 | Miller | .................... | G06N 7/005 726/22 |

FOREIGN PATENT DOCUMENTS

| | | |
|---|---|---|
| EP | 1197923 A2 | 4/2002 |
| JP | 2015088057 A | 5/2015 |
| JP | 6299151 B2 | 3/2018 |

OTHER PUBLICATIONS

Ralph Grabowski, "BricsCAD for AutoCAD users, 10th edition: Based on BricsCAD V17", Jan. 11, 2017, pp. 1-321.*

(Continued)

*Primary Examiner* — Juan C Ochoa
(74) *Attorney, Agent, or Firm* — Maschoff Brennan

(57) ABSTRACT

The current invention concerns a computer-implemented method, a computer system, and a computer program product for annotation positioning in a CAD drawing. A CAD drawing comprising N anchor points is obtained, with N≥2. A candidate set comprising multiple candidate points is obtained. From the candidate set, N placement points are selected. With each anchor point, a placement point is associated based on combinatorial optimization of an objective function dependent on distances. Each distance is thereby in between an anchor and a placement point. In the CAD drawing, for each anchor point, a leader line in between the anchor point and the associated placement point and an annotation label at or near the associated placement point are inserted.

21 Claims, 5 Drawing Sheets

(56) References Cited

OTHER PUBLICATIONS

Neil Jami, Point labeling with leaders for convex boundaries, 2012, Diss. Karlsruhe Informatics Institute, 86 pages.*
Edmonds et al.; "Theoretical Improvements in Algorithmic Efficiency for Network Flow Problems"; Journal of the Association for Computing machinery, vol. 19, No. 2, Apr. 1972, pp. 248-264.
Kuhn, H.W., "The Hungarian Method for the Assignment Problem", doi: 10.001/nav.3800020109, 1955.
N. Tomizawa, "One Some Techniques Useful for Solution of Transportation Network Problems", Networks, 1: 173-194, 1972 by John Wiley & Sons, Inc.
Anonymous, "About Creating Breaks in Dimensions", AutoCAD 2016, Autodesk Knowledge Network, Dec. 16, 2015, Retrieved from the Internet.

* cited by examiner

INSERTION OF ANNOTATION LABELS IN A CAD DRAWING

This application claims the benefit of European Application No. EP18195874.5 filed Sep. 21, 2018, which is hereby incorporated by reference in its entirety as if fully set forth herein.

TECHNICAL FIELD

The invention pertains to the technical field of computer-aided design (CAD). The invention may pertain to manipulating 3D models or images for computer graphics (IPC G06T19/00) and/or annotating and labelling (CPC G06T2219/004).

BACKGROUND

EP 1 197 923 B1 discloses a method and a system for assisting a user in selecting a location for placement of an annotation on an object so that it annotates the proper portion of the object and complies with applicable standards. The system displays a set of location points on the object to which the leader line of an annotation may be connected so that the annotation meets the requirements of applicable standards. The user may select any one of the location points. The set of location points may be an intersection of the surface of the object and an annotation plane.

U.S. Pat. No. 8,749,588 B2 discloses a method for positioning labels connected to objects in an engineering drawing. The connections are governed by relationships based on calculations simulating particle interactions and collision avoidance. A change in the position of a first label or of the engineering drawing is indicated. A new location of a second label is calculated such that the relationships between the second label and the engineering drawing and between the first and second labels are maintained, and the second label does not overlap other labels or objects in the engineering drawing. Anchor points may be associated with objects in the engineering drawing. Placement nodes may be associated with label locations. Leader lines may connect corresponding placement nodes and anchor points. The positioning of placement nodes may be governed by physical interactions between a placement node and another placement node and/or between a placement node and an anchor point. Disclosed physical interactions, such as mass-spring relationships, are pairwise and distance-dependent. In conjunction with FIG. 5, the document discloses the provision of a label plane, the determination of placement nodes in the label plane via projection of anchor points onto the label plane, and the rearrangement of these placement nodes based on interactions between the placement nodes in the label plane.

U.S. Pat. No. 8,749,588 B2 does not provide for avoiding the crossing of leader lines, which clogs an annotated engineering drawing. The document does not provide for efficient overlap avoidance of a label with an object other than the object corresponding to the label. While additional physical or non-physical constraints might potentially be added to mitigate such overlaps, this creates an unwantedly difficult model to solve, and entirely removes the intention of the document to provide a well-placed and dynamically responsive set of labels, due to the over-constraining. The document does not provide for suitable initial placement nodes for labels. The invention disclosed in the document is not efficient with respect to computer resources (CPU time and memory).

U.S. Pat. No. 7,636,096 B2 and JP 6 299 151 B2 concern avoiding the crossing of leader lines.

U.S. Pat. No. 7,636,096 B2 discloses ballooning an assembly drawing of a computer aided design. Balloons are arranged and connected via leader lines to anchor points, so that upon completion no two leader lines intersect. The document discloses arranging balloons along a line and connecting them via leader lines to anchor points, based on angles, in particular non-reflex angles. For a polygon enclosing a region including the set of anchor points, the region is divided into at least two sub-regions. A boundary of a sub-region includes at least a portion of a side of the polygon. Certain constraints regarding the tangency of a sub-region with the polygon are imposed. The set of balloons is arranged along the polygon such that an amount of balloons along a boundary of each sub-region is at least equal to an amount of anchor points included in the sub-region. The angle-based method is then performed per sub-region.

For concave sub-regions meeting all criteria, e.g. two hooked G-shaped sub-regions, it may occur that leader lines associated with different sub-regions intersect. The method is furthermore unsuitable for generic enclosures, e.g. a circle instead of a polygon, of a region including a set of anchor points. The document remains silent on distances.

JP 6 299 151 B2 concerns arrangement of annotation balloons for connection via leader lines with anchor points of an object. A plurality of placement points for the arrangement of the balloons are determined at regular intervals on an offset contour at a predetermined distance outwardly from the contour of the object (see FIG. 8 of JP 6 299 151 B2). Each of the balloons is assigned to the placement point closest to the corresponding anchor point (see FIG. 9 of JP 6 299 151 B2). A "balloon group" comprises the balloons assigned with one placement point. In case a balloon group comprises multiple balloons, one or more balloons of the balloon group are assigned to other placement points in the vicinity of the placement point of the balloon group, in such a way that an increase in the distance between balloons and anchor points is suppressed on the whole. When overlap of balloons occurs due to this spreading of balloons per balloon group, at least one of two balloon groups associated with the overlap is moved by an amount of movement calculated by using the number of balloons in each balloon group. Thus, ultimately at most one balloon is associated with a placement point.

The method requires more placement points than anchor points (see FIG. 17 of JP 6 299 151 B2). In case certain placement points and/or locations for placement points, associated with a balloon, are particularly desired for an output image, for example to limit a height, a width, an area or an aspect ratio of an output image for publication, the disclosed method may yield an undesired arrangement of balloons.

The present invention aims to resolve at least some of the problems mentioned above. The present invention provides an alternative solution to U.S. Pat. No. 7,636,096 B2 and JP 6 299 151 B2.

SUMMARY OF THE INVENTION

In a first aspect, the present invention provides a computer-implemented method (CIM) for inserting annotation labels in a computer-aided design (CAD) drawing, according to claim 1.

In a second aspect, the present invention provides a computer system for inserting annotation labels in a CAD drawing, whereby the computer system is configured for performing the CIM according to the first aspect.

In a third aspect, the present invention provides a computer program product (CPP) for inserting annotation labels in a CAD drawing, whereby the CPP comprises instructions which, when the CPP is executed by a computer, cause the computer to carry out the CIM according to the first aspect.

From the candidate set a number N of placement points is selected before associating with each anchor point one of the selected placement points. This is advantageous for several reasons. Retrieving pairs of anchor and placement points can be performed efficiently as the search space is not continuous, but consists of a discrete set of N placement points. The combinatorial optimization comprises less possible solutions as the search space is not continuous, which mitigates unwanted crossing of leader lines.

DESCRIPTION OF FIGS

DETAILED DESCRIPTION OF THE INVENTION

Figure 1A:
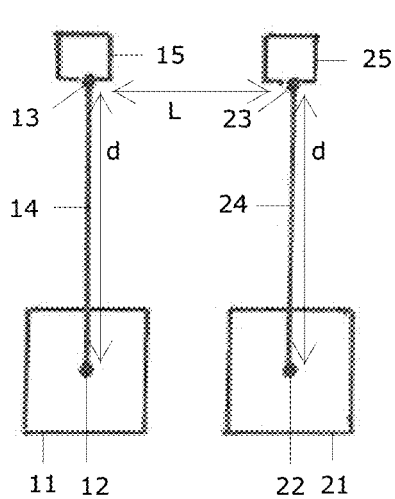
FIGS. 1A, 1B, 3A and 3B show examples of annotated CAD drawings.

The present invention concerns a computer-implemented method (CIM), a computer system, and a computer program product (CPP) for inserting annotation labels in a computer-aided design (CAD) drawing. The present invention has been summarized in the corresponding section above. In what follows, the present invention is described in detail, preferred embodiments are discussed, and the invention is illustrated by means of non-limiting examples.

Unless otherwise defined, all terms used in disclosing the invention, including technical and scientific terms, have the meaning as commonly understood by one of ordinary skill in the art to which this invention belongs. By means of further guidance, term definitions are included to better appreciate the teaching of the present invention.

Term Definitions

"A", "an", and "the" as used herein refers to both singular and plural referents unless the context clearly dictates otherwise. By way of example, "a compartment" refers to one or more than one compartment.

"Comprise", "comprising", and "comprises" and "comprised of" as used herein are synonymous with "include", "including", "includes" or "contain", "containing", "contains" and are inclusive or open-ended terms that specify the presence of what follows (e.g. component) and do not exclude or preclude the presence of additional, non-recited components, features, elements, members, steps, known in the art or disclosed therein.

"Based on" as used herein is synonymous with "based at least in part on" and is an inclusive or open-ended term that specifies the presence of what follows (e.g. component) and does not exclude or preclude the presence of additional, non-recited components, features, elements, members, and steps.

A "computer-aided design model" (CAD model) as used herein comprises computer-processable data, preferably digital data, about one or more objects. The data represents, or allows to derive, properties of an object, such as a geometric property, a material property and/or a semantic function classification. Said data furthermore represents, or allows to derive, relative geometric properties between multiple objects, such as pairs of objects. An "object" as used herein is a computer-processable, preferably digital, representation of a modelled element, such as a mechanical component or a building element, for example.

A CAD model may be edited via a corresponding CPP, so-called CAD software. A non-limiting list of examples of CAD software comprises 123D, ACIS, Advance Concrete, Advance Design, Advance Steel, AllyCAD, ArchiCAD, AutoCAD, BricsCAD, BRL-CAD, C3D, Caddie, Cadwork, CATIA, Chief Architect, Cobalt, Creo, DataCAD, DesignSpark Mechanical, Digital Project, Drawing Express, FINE MEP, form•Z, FreeCAD, HiCAD, IDEA Architectural, Inventor, IRONCAD, ItelliCAD, KeyCreator, LibreCAD, MEDUSA, MicroStation, Modelur, NanoCAD, NX, OpenCASCADE, OpenSCAD, Parasolid, PTC Creo, PowerCADD, progeCAD, PunchCAD, QCad, Revit Architecture, Revit MEP, Revit Structure, Rhinoceros 3D, RoutCad, SALOME, ShapeManager, SketchUp, Solid Edge, SolidWorks, SolveSpace, SpaceClaim, SpaceClaim Engineer, Tekla Structures, TopSolid, TransMagic, TurboCAD, VariCAD, VectorWorks, and VisualARQ.

A non-limiting list of examples of geometric properties of an object comprises a position; a dimension, such as a length, a width, a height, a thickness, a diameter, and the like; an area; a volume; a ratio of two dimensions; a ratio of two areas; a ratio of two volumes; a maximal dimension; a maximal area; a maximal volume; a measure of concavity; a measure of convexity; a radius of curvature; a ratio of a volume and a bounding box volume; an inclination, such as with the Z-direction (vertical axis); and an orientation.

"Semantic function classification", as used herein, refers to a function classification of an object, and may thereby relate to an intended use of the element which is modelled via the object. In an example, an object may comprise a boundary representation of a cogwheel, comprising several faces delimiting the volume of the cogwheel (e.g. teeth, side faces, cylindrical through-hole), and the object may further comprise a semantic function classification, i.e. an indication (e.g. reference, text, ISO number) denoting that the object is a 'cogwheel'.

A "computer-aided design drawing" (CAD drawing) as used herein comprises computer-processable data, preferably digital data, for displaying information about a CAD model via a tangible visual information representation means, preferably for two-dimensional information, such as images or sequences of images, i.e. a tangible visual two-dimensional information representation means. Examples of tangible visual two-dimensional information representation means are an electronic display, a projector, and a sheet of paper. Preferably, a CAD drawing is determined from a CAD model based on a cross-section plane, a viewing direction and/or a view frustum. Preferably, a CAD drawing comprises a drawing plane. Preferably, the drawing plane is a cross-section plane, a projection plane for projection of objects along a viewing direction, or a projection plane for projection of objects based on a view frustum. The CAD drawing may be displayed via a tangible visual information representation means. At least a part of the drawing plane of a CAD drawing may be displayed via a tangible visual two-dimensional information representation means. A CAD drawing may comprise one or more components, whereby each component is a representation of an object of a CAD model. A CAD drawing may in particular comprise a drawing plane comprising the one or more components.

Aspects of the Present Invention

In a first aspect, the present invention provides a CIM for inserting annotation labels in a CAD drawing, comprising several steps. In a second aspect, the present invention provides a computer system for inserting annotation labels in a CAD drawing, whereby the computer system is configured for performing the CIM according to the first aspect. In a third aspect, the present invention provides a CPP for inserting annotation labels in a CAD drawing, whereby the CPP comprises instructions for performing the CIM according to the first aspect. The CPP in particular comprises instructions, which, when the CPP is executed by a computer, cause the computer to carry out the CIM according to the first aspect. The invention further provides a tangible non-transitory computer-readable data carrier comprising the CPP. The aspects of the present invention are hence interrelated. Therefore, all features disclosed in this document, above or below, may relate to each of these aspects, even if they have been disclosed in conjunction with a particular aspect.

Figure 2:
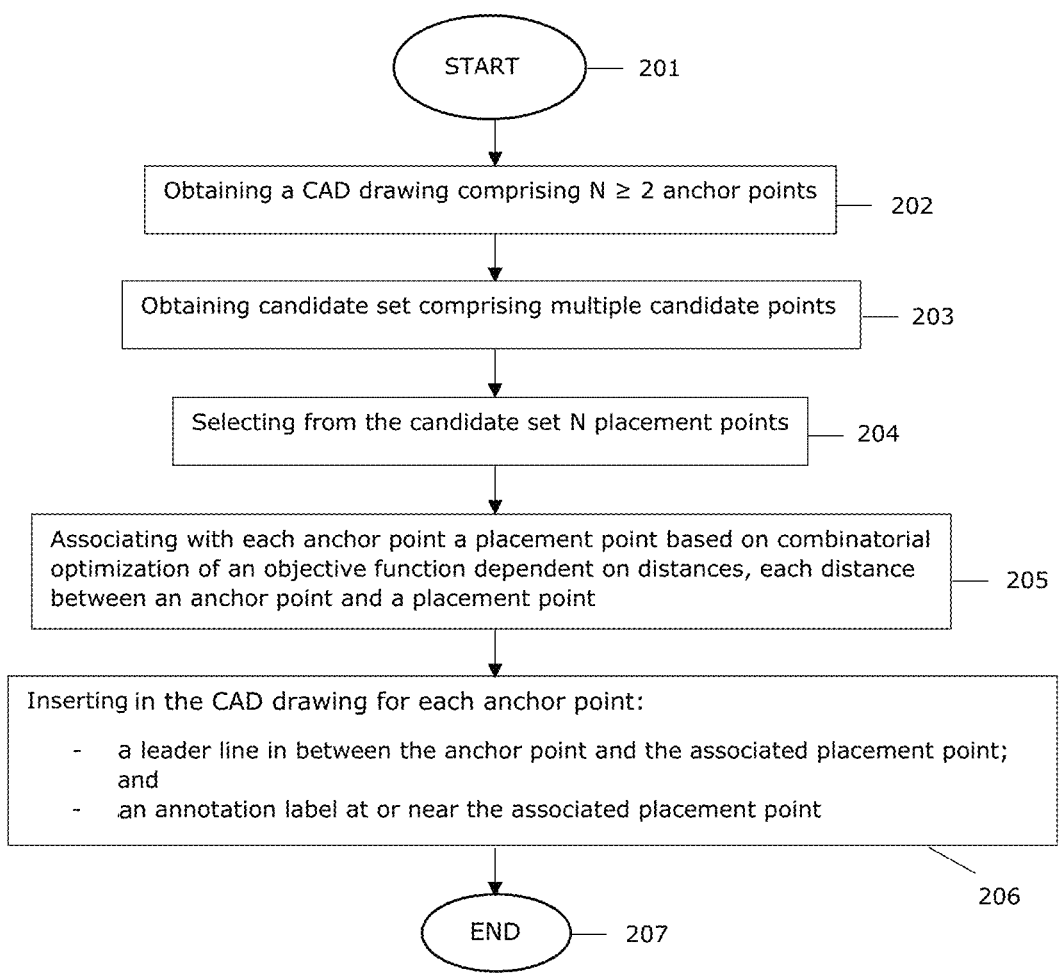
FIG. 2 shows a schematic representation of an algorithm according to the present invention.

FIG. 2 shows a schematic representation of a preferred embodiment, in particular a sequence of multiple steps from start (201) to end (207). A CAD drawing comprising at least two anchor points is obtained (202). Hence, a CAD drawing comprising N anchor points is obtained, with N 2. A candidate set comprising multiple candidate points is obtained (203). From the candidate set, multiple placement points, in number equal to the number of anchor points, are selected (204). Hence, from the candidate set N placement points are selected. The candidate set may comprise a finite number M of candidate points, with M N, or may be a continuous set of candidate points, e.g. a curve. With each anchor point, a placement point is associated, based on combinatorial optimization of an objective function dependent on distances (205). Each distance is thereby in between an anchor point and a placement point. In the CAD drawing, for each anchor point, a leader line in between the anchor point and the associated placement point and an annotation label at or near the associated placement point are inserted (206). One of ordinary skill in the art will appreciate that a leader line is positioned in between the corresponding anchor and placement points, but does not have to extend up to and including the placement point. For example, an annotation label may be a balloon comprising a textual reference number or letter, whereby the balloon is circular and centered on the placement point, whereby the leader line extends from the anchor point to the boundary of the balloon.

From the candidate set a number N of placement points is selected before associating with each anchor point one of the selected placement points. This is advantageous for several reasons. Retrieving pairs of anchor and placement points can be performed efficiently as the search space is not continuous, but consists of a discrete set of N placement points. The combinatorial optimization comprises less possible solutions because the search space is not continuous, which mitigates unwanted crossing of leader lines.

Figure 1B:
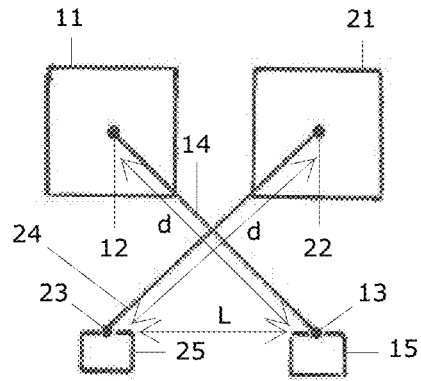

The latter is illustrated by means of FIGS. 1A and 1B, exemplifying prior art annotation positioning. A CAD drawing comprises a first component (11) and a second component (21). The first component (11) comprises an anchor point (12) from which a leader line (14) extends to a placement point (13). At the placement point (13) an annotation label is shown (15). The second component (21) comprises an anchor point (22) from which a leader line (24) extends to a placement point (23). At the placement point (23) an annotation label is shown (25). Without a priori determination of a discrete set of placement points, several distance-based equilibria may exist. In case of criteria based on distances (d) between anchor points and corresponding placement points, and distances (L) in between pairs of placement points, the solutions shown in FIGS. 1A and 1B are equivalent, leading in case of FIG. 1B to a crossing of the leader lines (14) and (24). The occurrence of multiple distance-based solutions can be avoided by first determining N placement points and then retrieving N pairs of anchor and placement points.

In a preferred embodiment, the CAD drawing comprises a drawing plane, whereby the drawing plane comprises the anchor and candidate points. In this embodiment, the objective function is dependent on distances in the drawing plane.

In a preferred embodiment, the CAD drawing comprising the annotation labels and leader lines is displayed via a tangible visual two-dimensional information representation means.

In a preferred embodiment, a digital two-dimensional pixelated or vector image file is generated based on the CAD drawing comprising the annotation labels and leader lines. The digital image file may, for example, be a vector image file in the Portable Document Format (PDF). The digital image file may, for example, be a pixelated image file in the Portable Network Graphics (PNG) format. The digital image file may, for example, be a vector image file in the so-called DWG format.

Combinatorial Optimization of the Objective Function

Preferably, the objective function is dependent on N distances. Preferably, each distance is thereby between an anchor point and a placement point. Preferably, each anchor point of the N anchor points is thereby associated with one of said N distances. Preferably, each placement point of the N selected placement points is associated with one anchor point of the N anchor points, and hence with one distance of the N distances. Preferably, the combinatorial optimization yields N pairs of associated anchor and placement points. Preferably, the combinatorial optimization targets to retrieve one of the factorial(N) possible pair combinations. Preferably, the combinatorial optimization is based on an objective function.

In a preferred embodiment, the objective function is dependent on N distances, whereby each anchor point is associated with one of said N distances, wherein further each distance is between an anchor point and a placement point, and wherein based on combinatorial optimization of the objective function each of the N placement points is associated with one of the N anchor points.

In a preferred embodiment, the objective function is configured to simultaneously minimize the N distances. This is advantageous as it mitigates crossing leader lines.

Figure 3A:
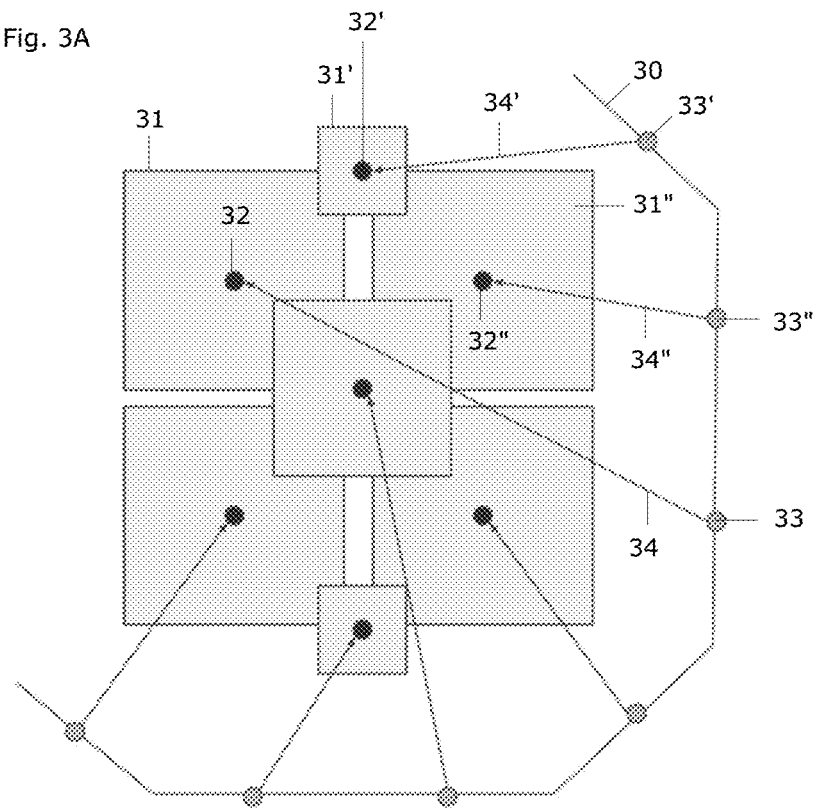
Figure 3B:
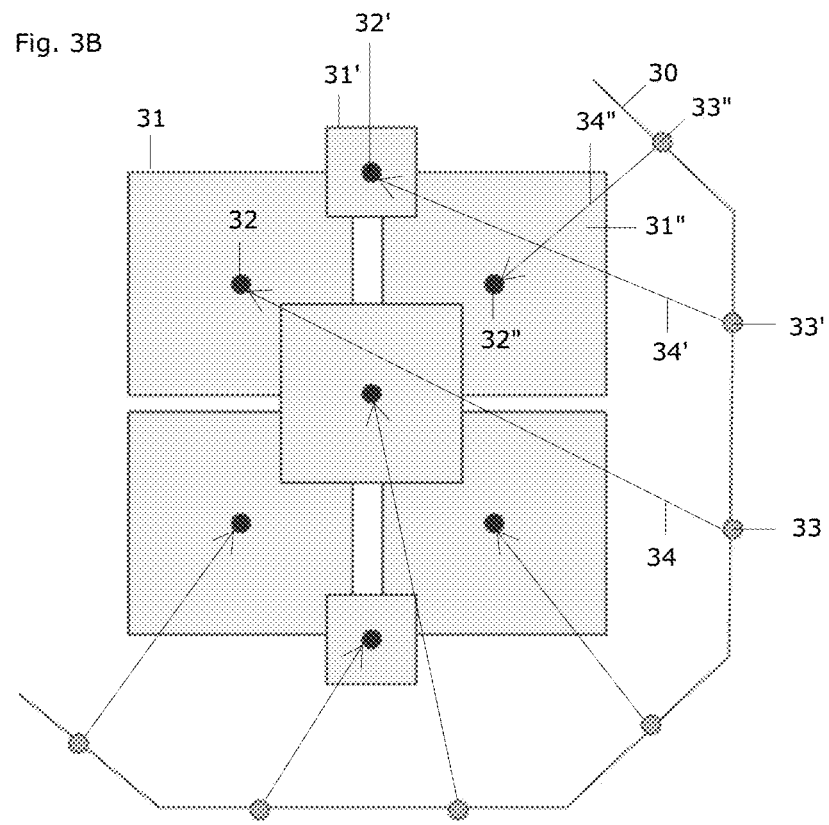

FIGS. 3A and 3B show examples of annotated CAD drawings. The CAD drawings comprise multiple components (31, 31', 31"), each comprising an anchor point (32, 32', 32"). From a candidate set (30) placement points (33, 33', 33") have been selected. Leader lines (34, 34', 34") are shown in between corresponding pairs of anchor and placement points. The crossing of the leader lines in FIG. 3B may be avoided by minimizing the distances in between anchor points and associated placement points, see FIG. 3A. Note in this respect, that a diagonal of a quadrilateral is always longer than an edge.

The objective function may be a product over a non-zero power of the distances, and in case the power is positive the optimization may aim to minimize the objective function, and in case the power is negative the optimization may aim to maximize the objective function.

The objective function may be a sum over a non-zero power of the distances, and in case the power is positive the optimization may aim to minimize the objective function, and in case the power is negative the optimization may aim to maximize the objective function.

In a preferred embodiment, for each anchor point $A_i$, with $1 \leq i \leq N$, and each placement point $P_j$, with $1 \leq j \leq N$, a distance $\|A_i - P_j\|$ may be calculated. The objective function f may be a product over a non-zero power z of N distances:

$$f(M : i \to j) = \sum_{i=1}^{N} \|A_i - P_{M(i)}\|^z$$

The objective function f may be a sum over a non-zero power z of N distances:

$$f(M : i \to j) = \sum_{i=1}^{N} \|A_i - P_{M(i)}\|^z$$

The combinatorial optimization of the objective function f determines the mapping M for associating with each anchor point $A_i$ a placement point $P_{M(i)}$. In this embodiment, based on combinatorial optimization of the objective function f, which is dependent on N distances, whereby each anchor point is associated with one of said N distances, whereby further each distance is between an anchor point and a placement point, each of the N placement points is associated with one of the N anchor points.

In a preferred embodiment, the objective function is a sum of N distances. In the notation adopted above, this yields (i.e. sum with z=1):

$$f(M : i \to j) = \sum_{i=1}^{N} \|A_i - P_{M(i)}\|$$

This is advantageous, as the objective function is representative of the total length of the leader lines in the CAD drawing.

The association of a placement point with each anchor point is a combinatorial assignment problem. In a preferred embodiment, the combinatorial optimization of the objective function is based on the Hungarian algorithm. Kuhn (H. W. Kuhn, 1955. "The Hungarian method for the assignment problem," Naval Research Logistics Quarterly, John Wiley & Sons, vol. 2(1-2), pages 83-97, March) discloses the Hungarian algorithm with O(N4) computational cost. Edmonds and Karp (J. Edmonds and R. Karp, 1972. "Theoretical Improvements in Algorithmic Efficiency for Network Flow Problems," Journal of the ACM, Vol. 19, Issue 2, April) and Tomizawa (N. Tomizawa, 1971. "On some techniques useful for solution of transportation network problems," Networks, Vol. 1, Issue 2, pg. 173-194) disclose modifications of the Hungarian algorithm (and are therefore based on the Hungarian algorithm) with O(N3) computational cost. These documents are hereby incorporated by reference.

The Hungarian algorithm may be based on a matrix formulation or a bipartite graph formulation. For the present computer-implemented invention, the matrix formulation is preferred.

In the matrix formulation, a non-negative N by N cost matrix is constructed, wherein the element $d_{ij}$ in the i-th row and j-th column of the cost matrix, with $1 \leq i \leq N$ and $1 \leq j \leq N$, represents the distance between anchor point i and placement point j: $d_{ij} = \|A_i - P_j\|$. In an equivalent formulation, element $d_{ij}$ represents the distance between anchor point j and placement point i. The rows and columns need to be assigned in a one-to-one correspondence, i.e. with each row one column needs to be assigned and with each column one row needs to be assigned, so that the sum of the corresponding elements in the cost matrix according to the assignment is minimal. If a number is added to or subtracted from all of the entries of any one row or column of the cost matrix, an optimal assignment for the resulting cost matrix is also an optimal assignment for the original cost matrix. This property stems from the objective function being a sum of N distances.

A variant of the Hungarian algorithm comprises the following steps:

1. Subtracting the smallest entry in each row from all entries in the row. This will make the smallest entry in the row now equal to zero. It may occur that multiple entries in a row are equal to zero.
2. Subtracting the smallest entry in each column from all entries in the column. This will make the smallest entry in the column now equal to zero. It may occur that multiple entries in a column are equal to zero.
3. Marking zero, one or more rows and zero, one or more columns, hereafter an entry being called a "marked entry" when the entry corresponds to a marked row and/or a marked column, wherein the marking is performed so that:
    all entries equal to zero are marked entries; and
    the total number of markings, being the number of marked rows plus the number of marked columns, is minimal.
4. Comparing the total number of markings with N. If the total number of markings equals N: assigning rows and columns in a one-to-one correspondence based on zeros in the matrix, and stopping the algorithm. If the total number of markings is less than N: performing step 5. (Note that marking each of the N rows results in marking all possible matrix entries, and that the total number of markings is therefore never larger than N.)
5. Identifying a smallest entry of the matrix which is not a marked entry. Subtracting this entry from all entries in each unmarked row. Adding this entry to all entries in each marked column. Performing step 3.

Note another variant of the Hungarian algorithm may be the above variant wherein "row" is replaced with "column" and vice versa. Example 2 illustrates the Hungarian algorithm for an exemplary cost matrix.

Candidate Set

In a preferred embodiment, the CAD drawing comprises a drawing plane, whereby the drawing plane comprises the anchor points and the candidate points of the candidate set. The objective function is in this embodiment dependent on distances in the drawing plane.

The candidate set may comprise a finite number M of candidate points, with M N. The candidate set may alternatively be a continuous set of candidate points. In a preferred embodiment, the candidate set is a curve. Preferably, the curve is a continuous one-dimensional curve. A non-limiting list of continuous one-dimensional curves comprises a line, a polyline, a spline, an arc, a circle and an ellipse. The curve may be obtained via a user input device. The curve may alternatively be automatically generated based on the CAD drawing. Preferably, the curve is a closed curve. Preferably, the curve is not self-intersecting. Preferably, the drawing plane comprises the curve.

In a preferred embodiment, on the curve N equidistant placement points are selected. The placement points may be equidistant in the drawing plane or may be equidistant along the curve. In the former case, a distance measure in between placement points identical to the distance measure for the objective function may be used. In the latter case, equidistance may be based on a measure of arc length along the curve.

The CAD drawing may comprise N components, whereby each component comprises an anchor point. In a preferred embodiment, the curve is a closed curve enclosing the components of the CAD drawing.

In a preferred embodiment, the closed curve enclosing the components of the CAD drawing is determined based on a distance of the closed curve to the components of the CAD drawing. In a first example, a centroid and a radius may be determined based on the components of the CAD drawing, whereby the closed curve is a circle enclosing the components of the CAD drawing. In a second example, a closed curve is determined based on an upper and a lower predefined distance, whereby the curve encloses the components of the CAD drawing and comprises at each point a smallest distance to the components of the CAD drawing in between the upper and lower predefined distance. In a third example, a closed curve based on a predefined distance is determined, whereby the curve encloses the components of the CAD drawing and comprises at each point a smallest distance to the components of the CAD drawing in essence equal to the predefined distance. In the latter two cases, the closed curve follows an outer contour of the components of the CAD drawing.

Object Information

A CAD model may be obtained. The CAD drawing may be determined from the CAD model based on a cross-section plane, a viewing direction and/or a view frustum. The CAD model may comprise a plurality of objects. Each object may comprise object information. The object information may comprise one or more geometric properties, one or more material properties (e.g. material type, physical material characteristic, material ISO classification) and/or a semantic function classification.

In a preferred embodiment, the CAD drawing comprises N components, whereby each component is a representation of an object of the CAD model, whereby further each object comprises an anchor point. In this embodiment, an inserted annotation label comprises annotation information based on the object information of the corresponding object. Hereby, the annotation information may:
- directly represent at least a part of the object information (e.g. text denoting semantic function classification, for example "cogwheel");
- comprise a reference (e.g. number, letter, pointer) to the object information; and/or
- comprise a reference (e.g. number, letter, pointer) to a list entry of a list, whereby a list entry comprises list information based on the object information (e.g. a bill of materials).

The object information may be an object property. The object property may comprise a geometric property, a material property or a semantic function classification. In a preferred embodiment, the annotation information is a reference, whereby references for objects comprising an identical object property are identical.

In a most preferred embodiment, an annotation label is a balloon. Preferably, the balloon comprises a reference. Preferably, references for objects comprising an identical object property are identical.

In a preferred embodiment, a list is inserted in the CAD drawing, whereby the list comprises the references and for each reference list information based on the object property. An example of such a list is a bill of materials.

The invention is further described by the following non-limiting examples which further illustrate the invention, and are not intended to, nor should they be interpreted to, limit the scope of the invention.

Example 1

Figure 4A:
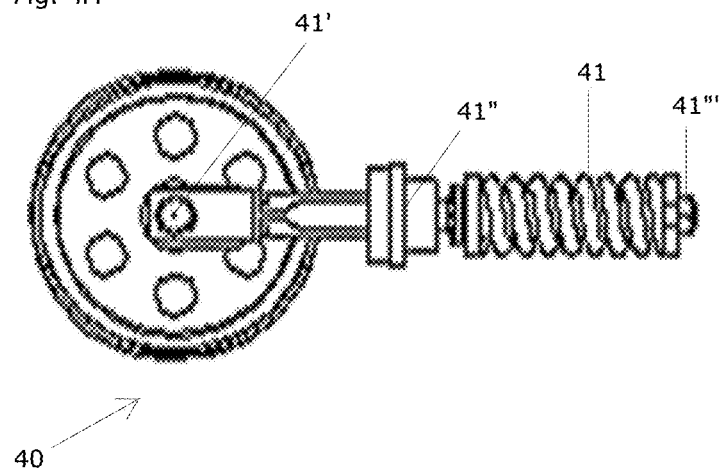
FIGS. 4A, 4B, 4C, 4D and 4E show examples of annotated CAD drawings according to the present invention.

FIGS. 4A, 4B, 4C, 4D and 4E show examples of annotated CAD drawings according to the present invention. FIG. 4A shows a CAD drawing (40) obtained from a CAD model based on a viewing direction. The CAD drawing comprises multiple components (41, 41', 41", 41'"), whereby each component is a representation of an object of the CAD model. Each component comprises an anchor point.

Figure 4B:
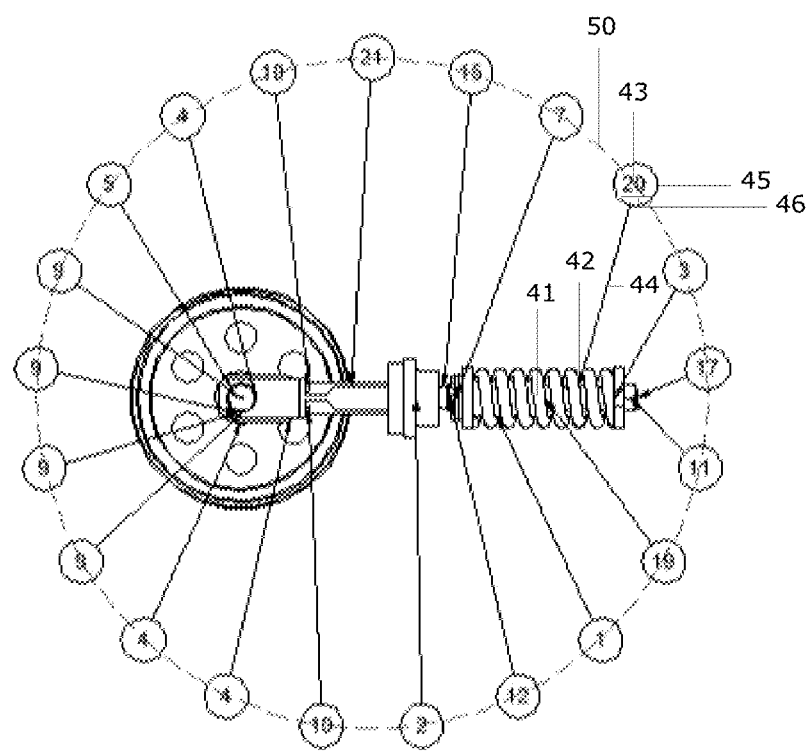
Figure 4C:
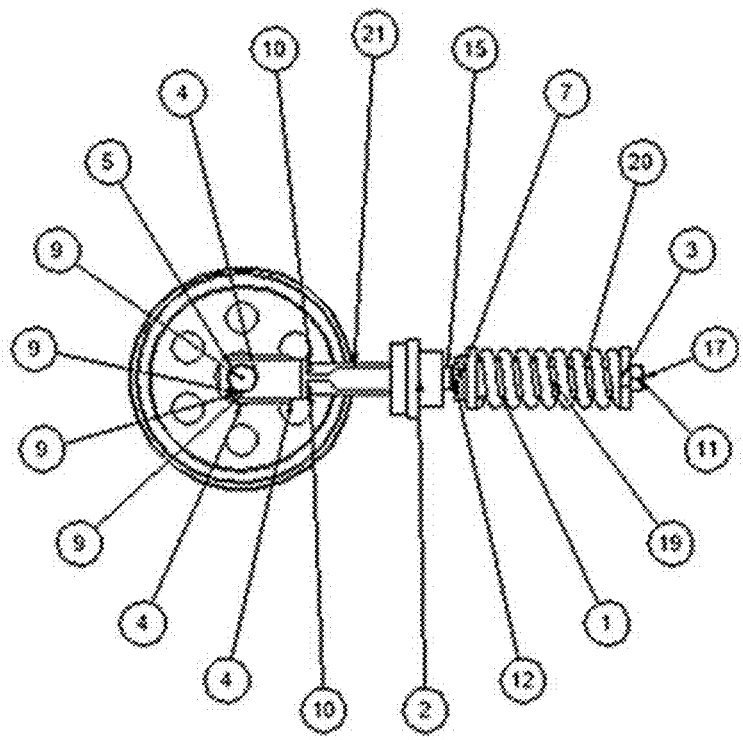
Figure 4D:
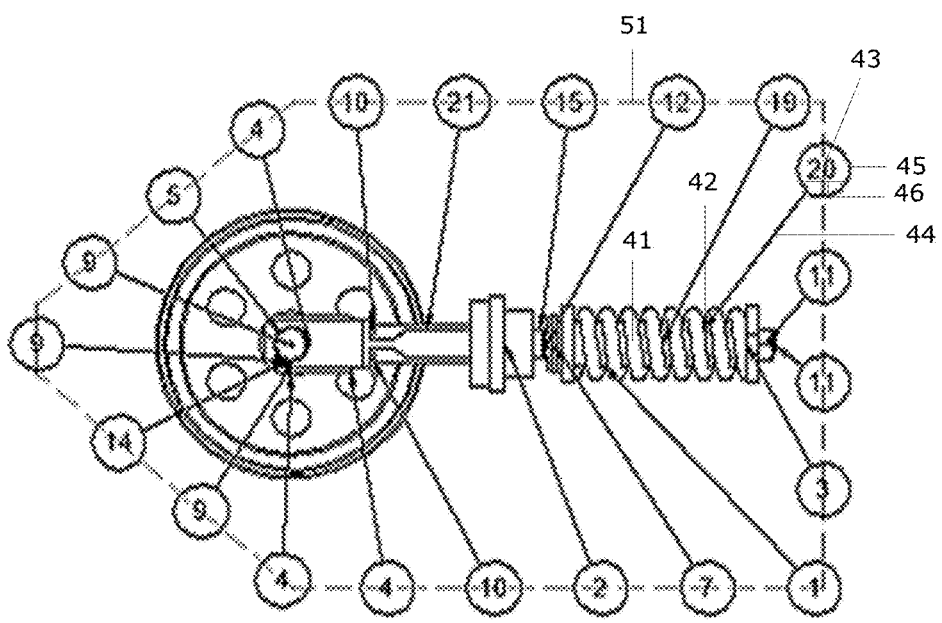

A closed curve (50, 51) enclosing the components of the CAD drawing is obtained. In FIG. 4B, the closed curve is a circle (50). In FIG. 4C, the closed curve is a polyline (51). Multiple placement points (43), in number equal to the number of components and hence the number of anchor points, are selected on the curve. The placement points are equidistant along the curve.

With each anchor point (42) a placement point (43) is associated based on minimization of the sum of distances between anchor and placement points. The combinatorial optimization is performed based on the Hungarian algorithm.

A leader line (44) is inserted between an anchor point (42) and the associated placement point (43). An annotation label (45) comprising a reference number (46) is inserted at the placement point. Note that the leader line is in between the anchor point and the placement point, but does not extend up to and including the placement point.

This way, for each component, an annotation label is suitably positioned, without crossing of leader lines.

Figure 4E:
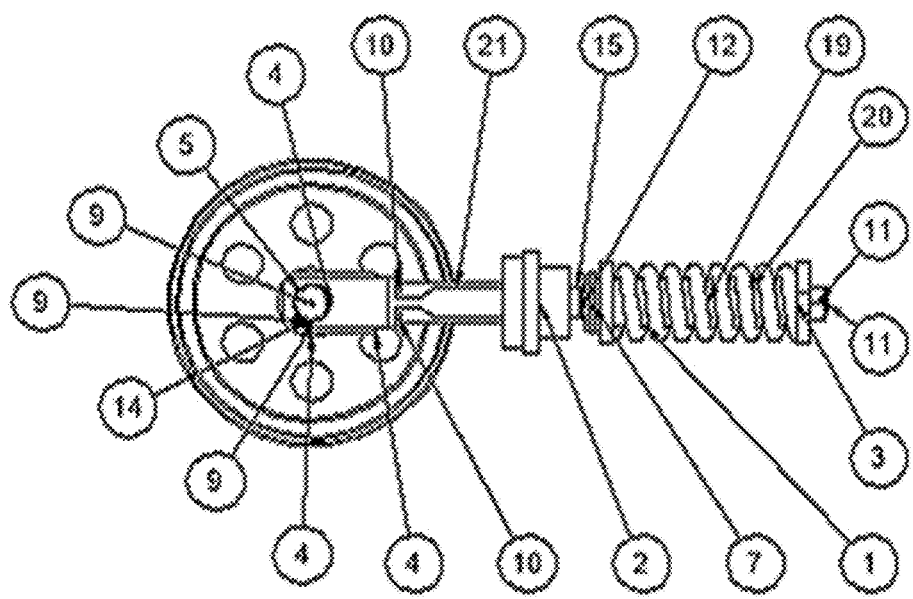

An exemplary bill of materials corresponding with the CAD drawing of FIGS. 4C and 4E is shown in Table 1.

TABLE 1

Exemplary bill of materials for the CAD drawing of FIGS. 4C and 4E.
Bill of Materials Front_Idler_Assembly

| No. | Component | Quantity |
| --- | --- | --- |
| 1 | Adjuster_Cylinder | 1 |
| 2 | Boss | 1 |
| 3 | Bracket_Adj | 1 |
| 4 | BRG. | 2 |
| 5 | Bushing | 2 |
| 6 | DIN 471xDSH-48 | 1 |
| 7 | Guide | 1 |
| 8 | Idler | 1 |
| 9 | Idler_Shaft | 1 |
| 10 | ISO 4017xM16 X 2xTHD-NONEx50 | 4 |
| 11 | ISO 4032xM42 X 4.5xTHD-NONEx0 | 1 |

TABLE 1-continued

Exemplary bill of materials for the CAD drawing of FIGS. 4C and 4E.
Bill of Materials Front_Idler_Assembly

| No. | Component | Quantity |
|---|---|---|
| 12 | ISO 4762xM12 X 1.75xTHD-NONEx30 | 8 |
| 13 | Packing | 1 |
| 14 | Pin | 2 |
| 15 | Piston | 1 |
| 16 | Ring | 1 |
| 17 | Rod | 1 |
| 18 | Seal_Group | 2 |
| 19 | Spacer | 1 |
| 20 | Spring | 1 |
| 21 | Yoke | 1 |

Example 2

Example 2 illustrates the Hungarian algorithm for an exemplary cost matrix. Suppose N=3 and the cost matrix is:

| 108 | 125 | 150 |
|---|---|---|
| 150 | 135 | 175 |
| 122 | 148 | 250 |

Subtracting the smallest entry in each row from all entries in the row (step 1) yields:

| 0 | 17 | 42 |
|---|---|---|
| 15 | 0 | 40 |
| 0 | 26 | 128 |

Subtracting the smallest entry in each column from all entries in the column (step 2) yields:

| 0 | 17 | 2 |
|---|---|---|
| 15 | 0 | 0 |
| 0 | 26 | 88 |

Marking a minimal number of rows and columns so that all zeros are marked (step 3) may be performed by marking the second row and the first column, requiring two markings. The markings are shown below in boldface:

| 0 | 17 | 2 |
|---|---|---|
| 15 | 0 | 0 |
| 0 | 26 | 88 |

In a computer-implemented version, the skilled person will appreciate that a list of row numbers and a list of column numbers may be constructed instead. The total number of markings equals 2, which is smaller than N=3 (step 4, first sentence). An optimal assignment is not yet possible. Step 5 needs to be performed.

The smallest unmarked entry is identified (step 5, first sentence), yielding entry 2 (in the first row and third column). Subtracting this entry from all entries in each unmarked row (step 5, second sentence) yields:

| −2 | 15 | 0 |
|---|---|---|
| 15 | 0 | 0 |
| −2 | 24 | 86 |

Adding this entry to all entries in each marked column (step 5, third sentence) yields:

| 0 | 15 | 0 |
|---|---|---|
| 17 | 0 | 0 |
| 0 | 24 | 86 |

Returning to step 3, the minimum number of rows and columns which need to be marked is equal to three, and hence equal to N. The following are possible sets of markings:
all rows may be marked;
all columns may be marked;
row 1, row 2 and column 1 may be marked;
row2, column 1 and column 3 may be marked.

A possible assignment of anchor points and placement points based on the zeros is:
anchor point 1 and placement point 3;
anchor point 2 and placement point 2;
anchor point 3 and placement point 1.

The invention claimed is:

1. Computer-implemented method for inserting annotation labels in a computer-aided design drawing, comprising the steps of:
obtaining the computer-aided design drawing comprising N anchor points with N ≥2;
obtaining a candidate set comprising multiple candidate placement points;
selecting from the candidate set a number N of placement points before associating with each anchor point one of the selected placement points;
associating with each of the N anchor points one of the N placement points based on combinatorial optimization of an objective function dependent on distances, each distance between an anchor and a placement point corresponding to a leader line length, the objective function being a product or sum over a non-zero power z of N distances between anchor points and associated placement points, and the combinatorial optimization resulting in retrieval of one of factorial N possible pair combinations that simultaneously minimizes the N distances;
inserting in the computer-aided design drawing for each anchor point:
a leader line in between the anchor point and the associated placement point; and
an annotation label at or adjacent to the associated placement point.

2. Computer-implemented method according to claim 1, wherein the computer-aided design drawing comprises a drawing plane, wherein the drawing plane comprises said anchor and candidate points, and wherein said objective function is dependent on distances in the drawing plane.

3. Computer-implemented method according to claim 1, wherein the objective function is dependent on N distances, wherein each anchor point is associated with one of said N distances, and wherein based on combinatorial optimization of the objective function each of the N placement points is associated with one of the N anchor points.

4. Computer-implemented method according to claim 1, wherein the objective function is a sum of N distances.

5. Computer-implemented method according to claim 1, wherein the combinatorial optimization of the objective function is based on the Hungarian algorithm.

6. Computer-implemented method according to claim 1, wherein said candidate set is a curve.

7. Computer-implemented method according to claim 6, wherein the step of selecting from the candidate set N placement points is the step of selecting on the curve the N placement points being N equidistant placement points.

8. Computer-implemented method according to claim 6, wherein the computer-aided design drawing comprises N components, each component comprising an anchor point, wherein the curve is a closed curve enclosing the components of the computer-aided design drawing.

9. Computer-implemented method according to claim 8, wherein the method comprises the step of determining the closed curve enclosing the components of the computer-aided design drawing based on a distance of the closed curve to the components of the computer-aided design drawing.

10. Computer-implemented method according to claim 1, comprising the steps of:
obtaining a computer-aided design model;
determining the computer-aided design drawing from the computer-aided design model based on a cross-section plane, a viewing direction and/or a view frustum.

11. Computer-implemented method according to claim 10, wherein the computer-aided design model comprises a plurality of objects, each object comprising object information, wherein the computer-aided design drawing comprises N components, each component being a representation of an object and comprising an anchor point, wherein an inserted annotation label comprises annotation information based on the object information of the corresponding object.

12. Computer-implemented method according to claim 11, wherein said object information comprises an object property, wherein said annotation information is a reference, and wherein references for objects comprising an identical object property are identical.

13. Computer-implemented method according to claim 12, wherein the method comprises the step of inserting in the computer-aided design drawing a list comprising said references and for each reference list information based on the object property.

14. Computer-implemented method according to claim 1, wherein the method comprises the step of storing a digital two-dimensional pixelated or vector image file based on the computer-aided design drawing comprising the annotation labels and leader lines on a tangible non-transitory computer-readable storage medium.

15. Computer-implemented method according to claim 1, wherein the method comprises the step of displaying the computer-aided design drawing comprising the annotation labels and leader lines via a tangible visual two-dimensional information representation means.

16. Computer-implemented method according to claim 1, wherein the distances are straight leader lines.

17. Computer-implemented method according to claim 16, wherein the objective function is a total length of the straight leader lines.

18. Computer-implemented method according to claim 7, wherein a user inputs the curve.

19. Computer-implemented method according to claim 18, further comprising user inputting the curve in the drawing plane.

20. Computer system for inserting annotation labels in a computer-aided design drawing, the computer system comprising a computer processor configured for performing the computer-implemented method according to claim 1.

21. A non-transitory computer-readable media storing instructions that in response to being executed by a computer, cause the computer to perform operations, the operations comprising method steps according to claim 1.

* * * * *